United States Patent [19]

Ueno

[11] Patent Number: 4,536,858
[45] Date of Patent: Aug. 20, 1985

[54] JUNCTION SHORT-CIRCUITING-TYPE PROGRAMMABLE READ-ONLY MEMORY DEVICE

[75] Inventor: Kouji Ueno, Kawasaki, Japan

[73] Assignee: Fujitsu Limited, Kawasaki, Japan

[21] Appl. No.: 406,096

[22] Filed: Aug. 6, 1982

[30] Foreign Application Priority Data

Aug. 8, 1981 [JP] Japan ................................ 56-124852

[51] Int. Cl.³ ............................................. G11C 11/40
[52] U.S. Cl. ..................................... 365/104; 365/174
[58] Field of Search ................... 365/94, 103, 104, 174

[56] References Cited

U.S. PATENT DOCUMENTS 4,376,984 3/1983 Fukushima et al. ................. 365/104

FOREIGN PATENT DOCUMENTS 55-55561 4/1980 Japan .

Primary Examiner—Joseph A. Popek
Attorney, Agent, or Firm—Staas & Halsey

[57] ABSTRACT

A junction short-circuiting-type programmable read-only memory (PROM) device comprises a plurality of striped buried layers (12) and a plurality of striped collector regions (13) thereon. In each of the collector regions, a plurality of base regions (15-0~15-5) are disposed in a row, and in each of the base regions one emitter region (16-0~16-5) is disposed. Further, in each of the collector regions, a plurality of high impurity regions (17'-1~17'-3) of the same conductivity type as the collector region, are formed respectively connected to the word lines, while each base region is connected to one bit line. Each of the high impurity regions are arranged for every two base regions.

6 Claims, 7 Drawing Figures

JUNCTION SHORT-CIRCUITING-TYPE PROGRAMMABLE READ-ONLY MEMORY DEVICE

BACKGROUND OF THE INVENTION

1. Field of the Invention

The present invention relates to a junction short-circuiting-type programmable read-only memory (PROM) device in which bipolar transistor technology is used.

2. Description of the Prior Art

In a general junction short-circuiting-type PROM device, a memory cell, which has the same structure as a conventional bipolar transistor, is located at each intersection of the word lines and bit lines. That is, one memory cell has a collector connected to one of the word lines, an emitter connected to one of the bit lines, and a floating-state base. When the memory cell is of the NPN type, the write-in operation for this memory cell is performed by supplying an excess current from the emitter to the collector so as to break down or short-circuit the PN junction between the emitter and the base. Therefore, the written-in memory cell serves as a diode.

According to the structure of a first prior art PROM device, a plurality of base regions are disposed within one collector region corresponding to one word line, and, in addition, one emitter region corresponding to one bit line is disposed within each base region. In this structure, however, one collector electrode is disposed for every four to eight base regions, that is, for every four to eight memory cells, and the write-in current fluctuates in accordance with the location of the cell, thereby causing an increase of the write-in current, which also causes the peripheral circuits to be complex. In addition, the resistance between the emitter and collector of a memory cell also fluctuates in accordance with the location of the cell. Therefore, in order to avoid an increase of the resistance between the emitter and collector of a memory cell, the size of the memory cell must be increased, thereby reducing integration.

According to the structure of a second prior art PROM device (see Japanese Unexamined Patent Publication (Kokai) No. 55-55561), the write-in current does not fluctuate in accordance with the location of the memory cell. That is, in this structure, disposed in a collector region are a collector electrode and two base regions on both sides thereof. In other words, two memory cells are formed in individual collector regions. In this structure, however, as compared with the first prior art PROM, the manufacturing yield is reduced, and, in addition, integration is reduced. Further, the access speed, which will be explained later, is reduced.

SUMMARY OF THE INVENTION

It is an object of the present invention to eliminate the above-mentioned problems in the first prior art PROM device without reducing the manufacturing yield, integration, and access speed.

In accordance with the present invention, having the structure of the first prior art PROM device, one collector electrode is disposed for every two base regions or for every two memory cells, thereby avoiding fluctuation of the write-in current that occurs in accordance with the location of a memory cell. In addition, the resistance between the emitter and collector of the memory cell is decreased so that integration is increased.

BRIEF DESCRIPTION OF THE DRAWINGS

The present invention will be more clearly understood from the description as set forth below, contrasting the present invention with the prior art and referring to the accompanying drawings, wherein.

DESCRIPTION OF THE PREFERRED EMBODIMENT

Figure 1:
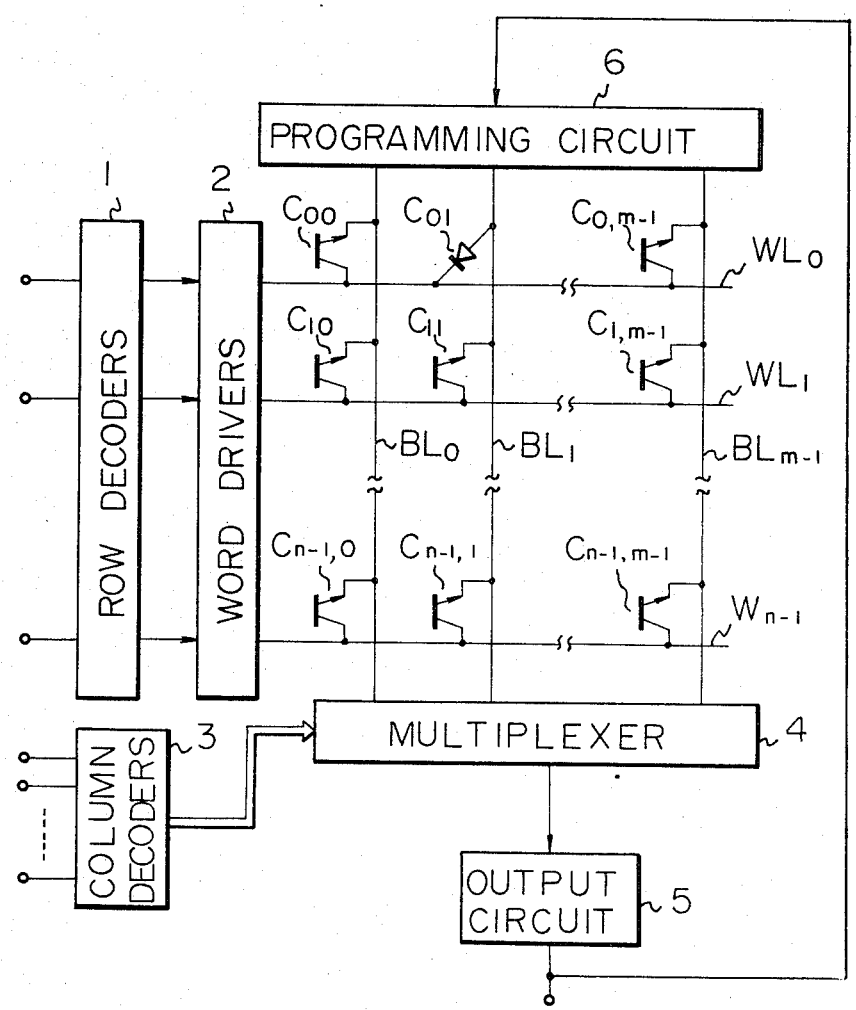
FIG. 1 is a block diagram of a general junction short-circuiting-type PROM device.

In FIG. 1, which illustrates a general junction short-circuiting-type PROM device, memory cells $C_{00}$, $C_{01}$, ..., $C_{0,m-1}$, $C_{10}$, $C_{11}$, ..., $C_{1,m-1}$; ...; $C_{n-1,0}$, $C_{n-1,1}$, ..., and $C_{n-1,m-1}$ are arranged at the intersections of word lines $WL_0$, $WL_1$, ..., and $WL_{n-1}$ and bit lines $BL_0$, $BL_1$, ..., and $BL_{m-1}$. One of the word lines $WL_0$, $WL_1$, ..., and $WL_{n-1}$ is selected by row decoders 1 and word drivers 2 while one of the bit lines $BL_0$, $BL_1$, ..., and $BL_{m-1}$ is selected by column decoders 3 and multiplexer 4. Thus, the read-out data is output from output circuit 5. In this case, the conduction state or non-conduction state of a memory cell corresponds to data "1" or "0". In the write-in operation for a memory cell such as $C_{01}$, programming circuit 6 supplies an excess current from bit line $BL_1$ through cell $C_{01}$ to word line $WL_0$ so as to short-circuit cell $C_{01}$, that is, so as to break down the junction between the emitter and base of cell $C_{01}$ to cause a permanent short-circuit therebetween. As a result, as illustrated in FIG. 1, cell $C_{01}$ serves as a diode.

Figure 2:
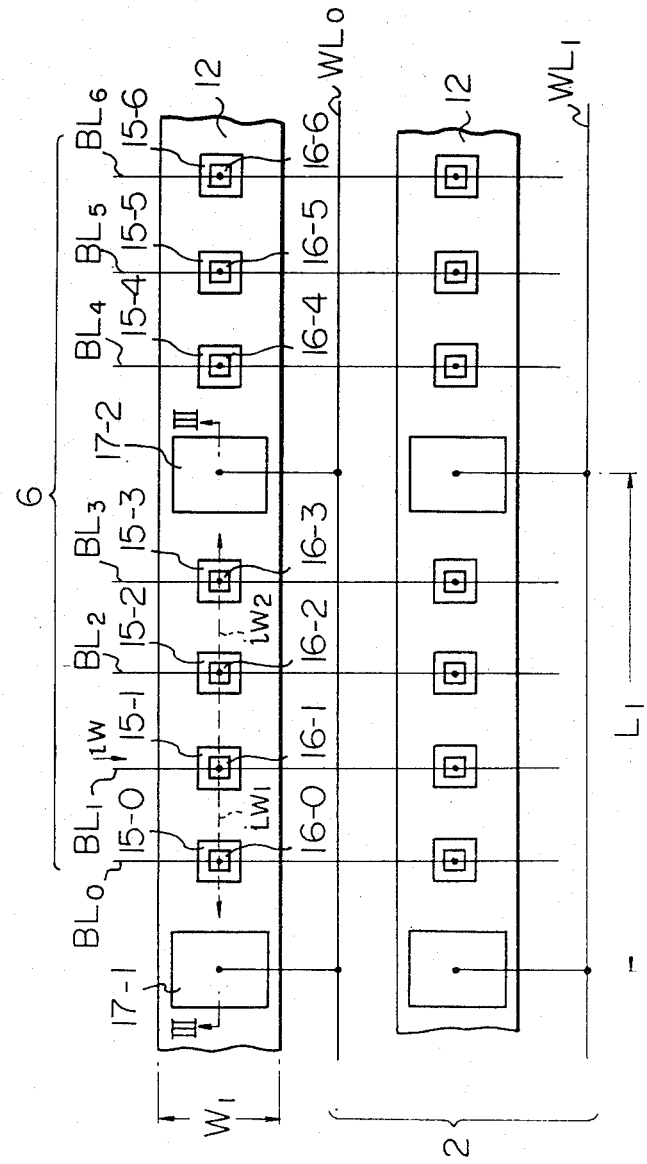
FIG. 2 is a plan view of a first prior art junction short-circuiting-type PROM device.
Figure 3:
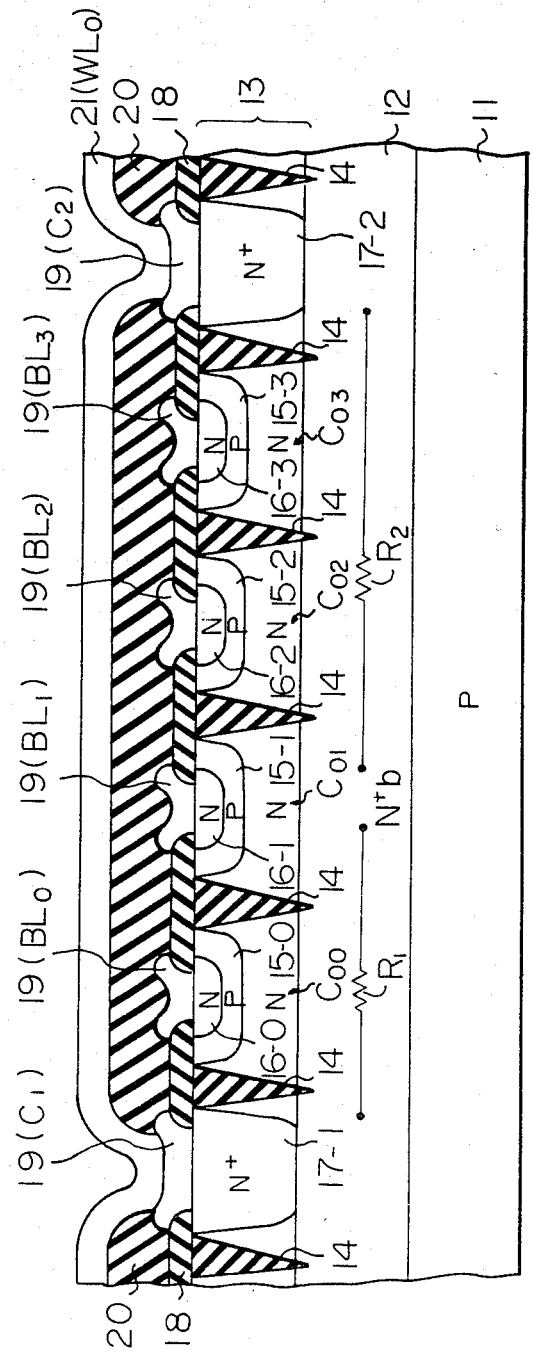
FIG. 3 is a cross-sectional view taken along line III—III of FIG. 2.

FIGS. 2 and 3 are diagrams of a first prior art junction short-circuiting-type PROM device, and reference numeral 11 of FIG. 3 designates a semiconductor substrate which is, for example, a P-type semiconductor substrate. On semiconductor substrate 11 are disposed $N^+$-type buried layer 12 and N-type epitaxial layer 13. Buried layer 12 is striped and corresponds to one word line $WL_0$ or $WL_1$. Epitaxial layer 13 serves as a collector region. In epitaxial layer 13, a plurality of V-groove isolation polycrystalline backfills 14 (VIP) are formed by vertical anisotropic etching (V-ATE). In addition, in epitaxial layer 13, a plurality of P-type regions or base regions 15-0, 15-1, 15-2, and 15-3, ... are formed, and in each base region, N-type regions, or emitter regions, 16-0, 16-1, 16-2, and 16-3 are formed. Further, $N^+$-type regions 17-1, 17-2, ..., are formed in epitaxial layer 13.

In FIG. 3, reference numeral 18 designates an isolation layer such as $SiO_2$; 19($C_1$), 19($BL_0$), 19($BL_1$), 19($BL_2$), 19($BL_3$), and 19($C_2$) designate first connection layers such as polycrystalline silicon; 20 designates an isolation layer such as phospho-silicate glass (PSG); and 21 designates a second connection layer such as aluminum. In more detail, connection layers 19($C_1$) and 19($C_2$) serve as collector electrodes; connection layers 19($BL_0$), 19($BL_1$), 19($BL_2$), and 19($BL_3$) serve as bit lines $BL_0$, $BL_1$, $BL_2$, and $BL_3$, respectively, of FIG. 2; and connection layer 21($WL_0$) serves as word line $WL_0$ of FIG. 2.

In the structure of the PROM device of FIGS. 2 and 3, since one collector electrode or region such as 17-1 is arranged for every four cells, there is a problem in that the write-in current fluctuates in accordance with the location of a cell.

For example, when writing is carried out in cell $C_{01}$, a reverse bias current $i_W$ is supplied from programming circuit 6 to the PN junction formed by emitter region 16-1 and base region 15-1, thereby breaking down the junction, that is, causing the junction to be in the conduction state. In this case, however, as illustrated in FIG. 2, write-in current $i_W$ is shunted to the right and left sides ($i_{W1}$, $i_{W2}$) of emitter region 16-1 or base region 15-1. In other words, write-in current $i_W$ is dispersed, thereby reducing the concentration of write-in current $i_W$. This is because structurally the ratio of the resistance $R_1$ (see FIG. 3) from cell $C_{01}$ to collector electrode 19($C_1$) is roughly commensurate with the resistance $R_2$ from cell $C_{01}$ to collector electrode 19($C_2$) that is, $R_1/R_2 \cong 0.67$. This means a larger current flow is necessary for short-circuiting the junction of cell $C_{01}$. On the other hand, when writing is carried out in cell $C_{00}$, the write-in current is barely shunted, resulting in an excellent concentration of the write-in current, thereby enabling short-circuiting of the junction with a smaller current.

There is a difference in the collector resistance (combined resistance) between cells $C_{00}$ and $C_{01}$, and, as a result, there is a difference in the write-in current between cells $C_{00}$ and $C_{01}$. Therefore, in order to avoid malfunctioning of the write-in operation, it is necessary to supply a larger write-in current cell $C_{01}$ than for cell $C_{00}$, which causes the peripheral circuits to be complex, and, in addition, reduces integration.

Figure 4:
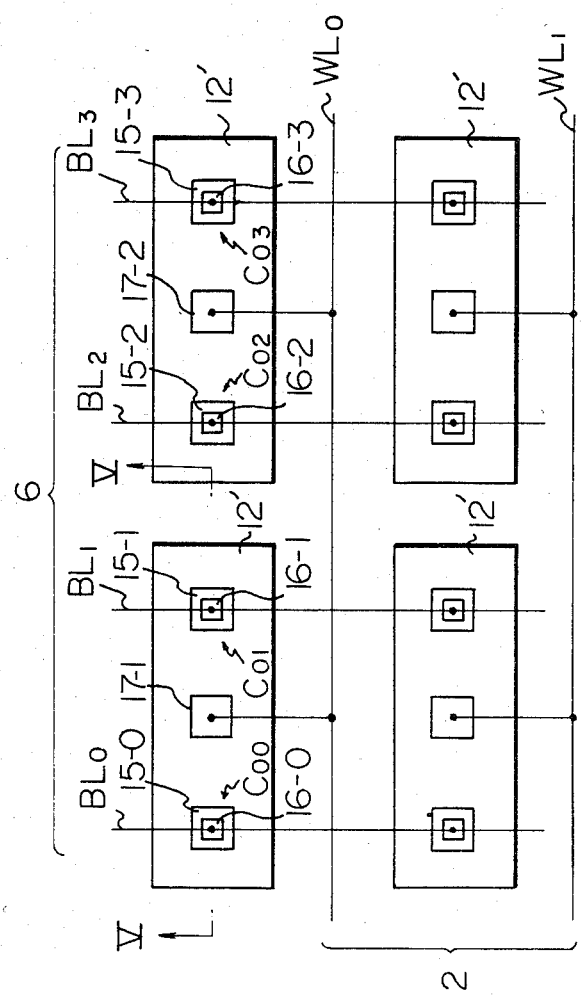
FIG. 4 is a plan view illustrating a second prior art junction short-circuiting-type PROM device.
Figure 5:
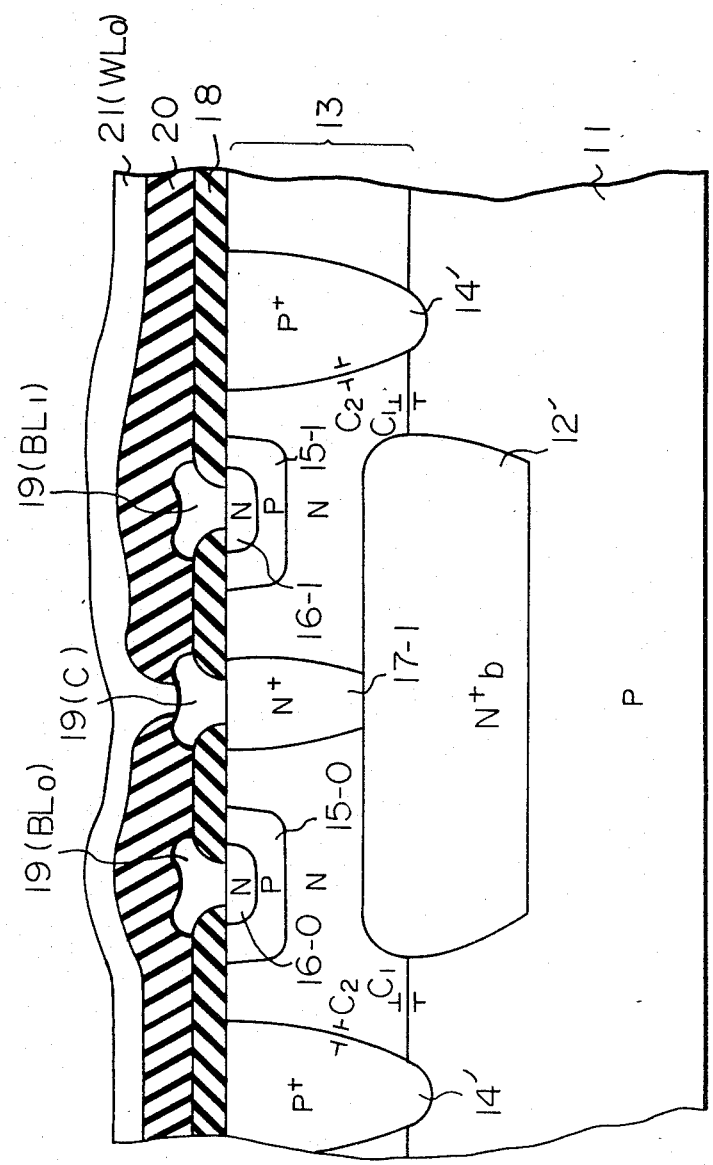
FIG. 5 is a cross-sectional view taken along line V—V of FIG. 4.

As means for solving such a problem in the structure of FIGS. 2 and 3, another junction short-circuiting-type PROM device as illustrated by FIGS. 4 and 5 is disclosed in Japanese Unexamined Patent Publication (Kokai) No. 55-55561. According to this structure, disposed in a striped collector region over buried layer 12' are one collector electrode 19(C) or N+-type region such as 17-1 and two base regions such as 15-0 and 15-1. That is, a combination of cells $C_{00}$ and $C_{01}$ and a combination of cells $C_{02}$ and $C_{03}$ are arranged in a collector region over buried layer 12'. In such a structure, the write-in current is concentrated on only one side of each cell, thereby equalizing the write-in current in each cell.

In the structure of FIGS. 4 and 5, however, an improvement of manufacturing yield, high integration, and high access speed cannot be expected. This will be explained in more detail.

First of all, as illustrated in FIG. 5, only one collector electrode 19(C) is provided in each collector region disposed over buried layer 12'. As a result, if there is a defect in the throughhole formed on the insulating layer 18 for connecting N+-type region 17-1 to collector electrode 19(C), the cell including such a defective throughhole cannot be saved since there is no other means for connecting the collector region to word line 21($WL_0$). In general, as the capacity of a PROM device is increased so as to have a high density, the manufacturing yield of such a throughhole is remarkably reduced. In addition, it is necessary to electrically isolate collector regions from each other, in the word line direction as well as in the bit line direction. This is accomplished by the provision of isolation diffusion regions 14'. However, these regions create a harmful effect in respect to high integration density.

Further, due to the presence of junction capacitance $C_1$ between the collector regions and substrate 11, junction capacitance $C_2$ between the collector regions and isolation diffusion regions 14', and the like, the load capacity of word line 21($WL_0$) connected to all such capacitances is remarkably increased and thereby the access speed of the PROM device is reduced.

Figure 6:
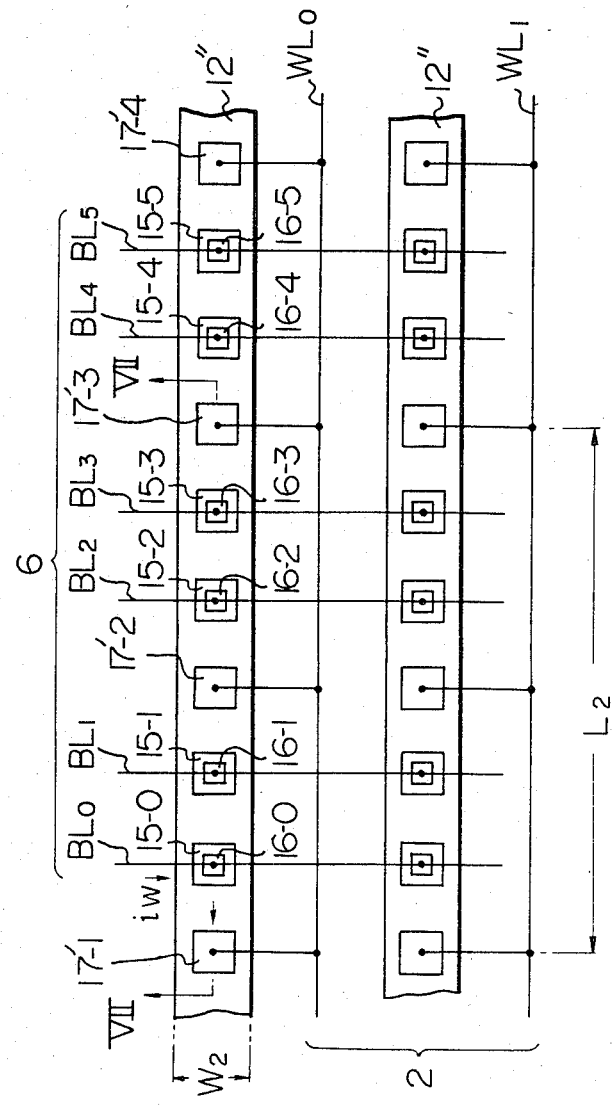
FIG. 6 is a plan view illustrating an embodiment of the junction short-circuiting-type PROM device according to the present invention.
Figure 7:
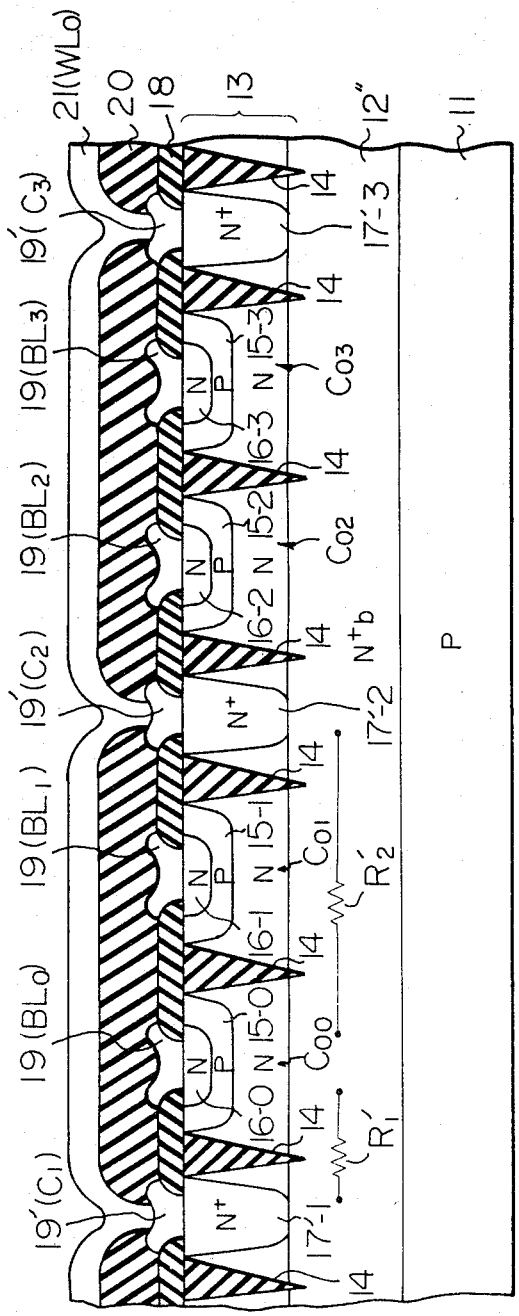
FIG. 7 is a cross-sectional view taken along line VII—VII of FIG. 6.

FIGS. 6 and 7 are diagrams of an embodiment of the present invention. The reference numerals which are the same as the reference numerals in FIGS. 2 and 3 designate the same regions and elements unless stated otherwise. One collector electrode such as 19'($C_1$) or one N+-type region such as 17'-1 is provided for every two memory cells while in the prior art device of FIGS. 2 and 3 one collector electrode such as 19($C_1$) or one N+-type region such as 17-1 is provided for every four memory cells.

The present invention is now compared with the prior art of FIGS. 2 and 3.

First of all, in the present invention, since one collector electrode such as 19'($C_1$), 19'($C_2$) or 19'($C_3$) is arranged for every two cells, the write-in current does not fluctuate in accordance with the location of a cell, and, in addition, a concentrated write-in current is effectively generated. For example, when writing is carried out in memory cell $C_{00}$, write-in current $i_W$ supplied from bit line $BL_0$ flows mainly to the side of N+-type region 17'-1 (collector electrode 19'($C_1$)) since the difference between resistance $R_1'$ (see FIG. 7) from cell $C_{00}$ to collector electrode 19'($C_1$) and resistance $R_2'$ from cell $C_{00}$ to collector electrode 19'($C_2$) is very large, that is, $R_1'/R_2' \cong 0.06$. Note that such a ratio of the prior art is about 0.67. Therefore, in the present invention, no substantial dispersion of the write-in current is generated, thereby effectively enabling breakdown or short-circuiting of a cell.

In addition, the present invention is advantageous as compared with the prior art of FIGS. 2 and 3 in that integration density is high. That is, due to the fact that all the cells are close to a corresponding collector electrode such as 19' ($C_1$), the combined collector resistance, which is almost the same in all the cells, is very small. As a result, the width $W_2$ of the collector region or buried layer 12" can be reduced as compared to the prior art of FIGS. 2 and 3. Therefore, although an increase of collector electrodes may increase length $L_2$ for every four cells, high integration can be obtained, for example:

$W_2 \cong 0.6 W_1$ $L_2 \cong 1.1 L_1$

Therefore, $W_2 L_2 \cong 0.66 W_1 L_1$ can be expected, so that the size of a cell can be reduced.

The present invention is now compared with the prior art of FIGS. 4 and 5.

First of all, in the present invention, the manufacturing yield is improved. As mentioned above, higher integration is obtained, and the manufacturing yield of throughholes formed on the insulating layer 18 is reduced. In the present invention, however, even when there is a defective throughhole for connecting one collector region to a corresponding word line, the collector region may be connected to the word line through another throughhole. That is, since a plurality of collector electrodes are provided in each collector region, the write-in current can be supplied and the read-out operation can be performed by using another throughhole, thereby compensating for such a defective throughhole. Therefore, the memory cells are saved in spite of having a defective throughhole, thereby improving the manufacturing yield.

In addition, no isolation diffusion regions 14' such as those of the prior art are necessary, thereby minimizing the distance between the cells. Further, there are no junction capacitances $C_1$ and $C_2$ such as those of the prior art mentioned above, and the load capacity of a word line is reduced, thereby enabling a high access speed.

Note that, in this embodiment, an isolation region between the striped collector regions formed by epitaxial layer 13 is also formed by using VIP (not shown). Of course, buried layer 12″, forming the common collector region is also striped. Further, the presence of a VIP between the cells can prevent latching-up of parasitic PNPN thyristors therebetween. Furthermore, diffusion layers designated by 15-0, 16-0, 17'-1, and the like, can be manufactured by self-alignment due to the presence of such VIP, which is beneficial in respect to high integration density. However, it should be noted that such VIP can be omitted in the device of FIG. 7.

Thus, according to the present invention, the write-in current fluctuation in accordance with the location of a cell is improved, and, in addition, the write-in current concentration at the junction of a cell is improved without reducing the manufacturing yield, high integration density, and high access speed.

I claim:

1. A junction short-circuiting-type programmable read-only memory (PROM) device having regions with high concentrations of impurities, comprising:
   a plurality of word lines;
   a plurality of bit lines;
   a semiconductor substrate of a first conductivity type;
   a plurality of first collector regions of a second conductivity type opposite of the first conductivity type, formed on said semiconductor substrate, comprising a plurality of striped buried layers having a high concentration of impurities;
   a plurality of second collector regions of the second conductivity type, respectively formed on said plurality of striped buried layers;
   a plurality of base regions of the first conductivity type, respectively formed in said plurality of second collector regions;
   a plurality of emitter regions of the second conductivity type, respectively formed in said plurality of base regions and respectively, operatively connected to said plurality of bit lines; and
   a plurality of word line contact regions of the second conductivity type, a group of said plurality of word line contact regions formed in one of said plurality of second collector regions and operatively connected to one of said plurality of word lines, each said word line contact region being disposed between sets of two adjacent ones of said plurality of base regions.

2. A device as set forth in claim 1, wherein said plurality of second collector regions further comprise a plurality of V-groove isolation regions respectively disposed adjacent to said plurality of base regions and said plurality of word line contact regions.

3. A device as set forth in claim 2, wherein said V-groove isolation regions comprise V-groove isolation polycrystalline backfills.

4. A device as set forth in claim 1, wherein said plurality of word line contact regions comprise high impurity concentration regions of the second conductivity type extending to said striped buried layers, respectively.

5. A junction short-circuiting-type programmable read-only memory (PROM) device having a plurality of word lines and bit lines, and formed on a semiconductor substrate of a first conductivity type, the device comprising:
   a striped buried layer of a second conductivity type opposite that of the first conductivity type, formed on the semiconductor substrate, for forming a common collector region;
   a striped epitaxial layer of the second conductivity type, formed on said striped buried layer, for forming striped collector regions;
   base regions of the first conductivity type formed in said striped epitaxial layer;
   emitter regions of the second conductivity type respectively formed in said base regions and, respectively, operatively connected to the plurality of bit lines; and
   word line contact regions of the second conductivity type, having a high concentration of impurities, formed in said epitaxial layer, said word line contact regions respectively disposed between sets of two of said base regions and respectively, operatively connected to the plurality of word lines.

6. A device as set forth in claim 5, wherein said epitaxial layer further comprises V-shaped isolation regions respectively formed adjacent to said base regions and said word line contact regions.

* * * * *

UNITED STATES PATENT AND TRADEMARK OFFICE
CERTIFICATE OF CORRECTION

PATENT NO. : 4,536,858
DATED : AUGUST 20, 1985
INVENTOR(S) : KOUJI UENO

It is certified that error appears in the above-identified patent and that said Letters Patent is hereby corrected as shown below:

Col. 3, line 38, after "current" insert --for--.

Col. 4, line 3, "other," should be --other--;
line 34, "$BL_o$" should be --$BL_0$--.

Signed and Sealed this

Nineteenth Day of November 1985

[SEAL]

Attest:

Attesting Officer

DONALD J. QUIGG

Commissioner of Patents and Trademarks